US012745525B2

(12) United States Patent
Du et al.

(10) Patent No.: US 12,745,525 B2
(45) Date of Patent: Sep. 22, 2026

(54) DISPLAY PANELS AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventors: Minchen Du, Wuhan (CN); Songpo Xiang, Wuhan (CN); Shaojing Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 362 days.

(21) Appl. No.: 18/565,102

(22) PCT Filed: Nov. 2, 2023

(86) PCT No.: PCT/CN2023/129309
§ 371 (c)(1),
(2) Date: Nov. 29, 2023

(87) PCT Pub. No.: WO2025/086325
PCT Pub. Date: May 1, 2025

(65) Prior Publication Data
US 2025/0143105 A1 May 1, 2025

(30) Foreign Application Priority Data
Oct. 25, 2023 (CN) ......................... 202311403512.8

(51) Int. Cl.
*H10K 59/131* (2023.01)

(52) U.S. Cl.
CPC ................................. *H10K 59/131* (2023.02)

(58) Field of Classification Search
CPC ................................................... H10K 59/131
See application file for complete search history.

(56) References Cited

U.S. PATENT DOCUMENTS

2022/0406881 A1* 12/2022 Wang ................ H10K 59/1315

FOREIGN PATENT DOCUMENTS

CN 112750884 A 5/2021
CN 114792512 A 7/2022
(Continued)

OTHER PUBLICATIONS

International Search Report in International application No. PCT/CN2023/129309,mailed on Dec. 5, 2023.
(Continued)

*Primary Examiner* — Richard A Booth
(74) *Attorney, Agent, or Firm* — PV IP PC; Peter Stecher; Wei Te Chung

(57) ABSTRACT

The present disclosure provides display panels and display devices. There is at least one first connection line including a plurality of first connection segments each extending along a first direction, a plurality of second connection segments each extending along the first direction, and a plurality of third connection segments each extending along a second direction. The plurality of first connection segments and the plurality of second connection segments are alternately and staggered along the first direction. The first connection segment and one adjacent second connection segment are connected to both sides of one third connection segment in the first direction.

20 Claims, 4 Drawing Sheets

(56) References Cited

FOREIGN PATENT DOCUMENTS

| | | | |
|---|---|---|---|
| CN | 115132760 | A | 9/2022 |
| CN | 115132811 | A | 9/2022 |
| CN | 115206222 | A | 10/2022 |
| CN | 115241395 | A | 10/2022 |
| CN | 115360313 | A | 11/2022 |
| WO | 2023000125 | A1 | 1/2023 |
| WO | 2023155140 | A1 | 8/2023 |

OTHER PUBLICATIONS

Written Opinion of the International Search Authority in International application No. PCT/CN2023/129309,mailed on Dec. 5, 2023.

Chinese Office Action issued in corresponding Chinese Patent Application No. 202311403512.8 dated Jan. 18, 2025, pp. 1-8.

Chinese Office Action issued in corresponding Chinese Patent Application No. 202311403512.8 dated Apr. 11, 2025, pp. 1-6.

* cited by examiner

DISPLAY PANELS AND DISPLAY DEVICES

CROSS-REFERENCE TO RELATED APPLICATION

This application is a national stage of International Application No. PCT/CN2023/129309, filed on Nov. 2, 2023, which claims priority to Chinese Patent Application No. 202311403512.8, filed on Oct. 25, 2023. The aforementioned applications are herein incorporated by references in their entireties.

TECHNICAL FIELD

The present disclosure relates to the field of display technologies, and in particular, to display panels and display devices.

BACKGROUND

Organic light-emitting diode (OLED) display panels have gradually become a new generation of display technology due to their high contrast, wide color gamut, low power consumption, and other characteristics. With the development of organic light-emitting diode display panel technology, narrow bezel technology has become a differentiated technology that attracts user groups. In order to achieve narrow bezel technology, technical solutions of fanout in active area (FIAA) are applied to the organic light-emitting diode display panels. However, the technical solutions of FIAA may cause the symmetry of the viewing angle to deteriorate when the organic light-emitting diode display panel displays.

Therefore, it is necessary to propose technical solutions to solve the problem that the symmetry of the viewing angle of the organic light-emitting diode display panel deteriorates in the solutions of FIAA.

SUMMARY

The present disclosure provides display panels and display devices to relieve the problem that the symmetry of the viewing angle of the organic light-emitting diode display panel deteriorates due to the solutions of FIAA.

In a first aspect, the present disclosure provides a display panel, which includes a base layer, a first metal layer, and a second metal layer. The first metal layer is disposed on the base layer and includes a plurality of data lines arranged in the display area. The second metal layer is disposed on the base layer and is insulated from the first metal layer. The second metal layer includes a plurality of connection wirings arranged in the display area. The plurality of connection wirings are arranged at intervals and are respectively connected to the plurality of data lines. Each connection wiring includes a first connection line and a second connection line connected to each other. The second connection line is bent relative to the first connection line. Each first connection line is connected between one second connection line and one data line. There is at least one first connection line including a plurality of first connection segments extending along the first direction, a plurality of second connection segments extending along the first direction, and a plurality of third connection segments extending along the second direction. The plurality of first connection segments and the plurality of second connection segments are alternately and staggered along the first direction. The first connection segment and one adjacent second connection segment are connected to both sides of one third connection segment in the first direction. The first direction intersects with the second direction.

In some embodiments, the display panel further includes a light-emitting element layer disposed on sides of the first metal layer and the second metal layer away from the base layer, and the light-emitting element layer includes a anode layer, light-emitting layers, and a cathode layer; the light-emitting layers are disposed between the anode layer and the cathode layer, the anode layer is located on a side of the light-emitting layers adjacent to the base layer and includes a plurality of anodes arranged at intervals;

herein, there is at least one first connection segment of the plurality of first connection segments and at least one second connection segment of the plurality of second connection segments, orthographic projections of the at least one first connection segment and the at least one second connection segment on the base layer do not overlap with orthographic projections of the plurality of anodes on the base layer; and there is at least one third connection segment of the plurality of third connection segments, and an orthographic projection of a portion of the at least one third connection segment on the base layer does not overlap with the orthographic projections of the plurality of anodes on the base layer.

In some embodiments, the at least one first connection line further includes a plurality of fourth connection segments each extending along the second direction, each of the plurality of fourth connection segments is disposed between two adjacent ones of the plurality of third connection segments, the plurality of fourth connection segments and the plurality of third connection segments are staggered along the first direction, and each of the plurality of fourth connection segments is connected to one of the plurality of first connection segments or one of the plurality of second connection segments.

In some embodiments, there is at least one fourth connection segment of the plurality of fourth connection segments, and an orthographic projection of the at least one fourth connection segment on the base layer overlaps with an orthographic projection of at least one anode of the plurality of anodes on the base layer.

In some embodiments, a length of each of the first connection segments is greater than a length of each of the second connection segments, and each of the fourth connection segments is connected to one of the first connection segments.

In some embodiments, the plurality of first connection lines of the plurality of connection wirings are arranged along the second direction;

there are at least two adjacent first connection lines of the plurality of first connection lines, each of the at least two adjacent first connection lines includes the plurality of first connection segments, the plurality of second connection segments, the plurality of third connection segments, and the plurality of fourth connection segments; and there is a first gap between two adjacent third connection segments of the third connection segments of the at least two adjacent first connection lines, where the two adjacent third connection segments are aligned along the second direction; there is a second gap between two adjacent fourth connection segments of the fourth connection segments of the at least two adjacent first connection lines, where the two adjacent fourth connection segments are aligned along the second direction; and the first gap and the second gap are misaligned along the first direction.

In some embodiments, there is at least one second connection line of a plurality of second connection lines of the plurality of connection wirings, and the at least one second connection line includes a fifth connection segment extending along the second direction and a plurality of sixth connection segments each extending along the first direction, the fifth connection segment is disposed on a side of the first connection line away from the one of the data lines connected to the first connection line, the fifth connection segment is connected to one of the plurality of first connection segments or one of the plurality of second connection segments, and the plurality of sixth connection segments are connected to the fifth connection segment.

In some embodiments, the plurality of second connection lines of the plurality of connection wirings are arranged along the first direction;

there are at least two adjacent second connection lines of the plurality of second connection lines, each of the at least two adjacent second connection lines includes the fifth connection segment and the plurality of sixth connection segments, there is a third gap between two adjacent sixth connection segments of the sixth connection segments of the at least two adjacent second connection lines, where the two adjacent sixth connection segments are aligned along the first direction, and the third gap, the first gap, and the second gap are misaligned along the first direction.

In some embodiments, the first gap, at least one of the first gap, the second gap, and the third gap has an orthographic projection on the base layer non-overlapping with the orthographic projections of the plurality of anodes on the base layer.

In some embodiments, the display panel further includes a metal compensation pattern, and an orthographic projection of the metal compensation pattern on the base layer overlaps with an orthographic projection of at least one of the first gap, the second gap, and the third gap on the base layer.

In some embodiments, the first metal layer includes the metal compensation pattern.

In some embodiments, the metal compensation pattern and the second metal layer include the same material.

In some embodiments, the display panel further includes an insulation layer disposed between the first metal layer and the second metal layer and including a plurality of via holes, the plurality of connection wirings are connected to the plurality of data lines respectively through the plurality of via holes, and orthographic projection of the plurality of via holes on the base layer and the orthographic projections of the plurality of anodes on the base layer are arranged in a staggered manner.

In some embodiments, each of the plurality of data lines extends along the second direction.

In some embodiments, the display panel further includes a bonding area disposed outside the display area; and the second metal layer further includes a compensation grid pattern arranged in the display area and disposed on a side of the plurality of connection wirings away from the bonding area, the compensation grid pattern includes a plurality of interconnected metal grids, and each of the metal grids is arranged around a grid opening.

In some embodiments, each of the metal grids includes first grid lines each extending along the first direction and second grid lines each extending along the second direction, and the first grid lines are connected to the second grid lines.

In some embodiments, the compensation grid pattern is connected to the cathode layer.

In a second aspect, the present disclosure also provides a display device, which includes the above-mentioned display panel.

Beneficial Effects

In some embodiments of the present disclosure, the plurality of first connection segments and the plurality of second connection segments are alternately and staggered along the first direction. One first connection segment and an adjacent one second connection segment are connected to both sides of one third connection segment in the first direction, which realizes connections between the plurality of first connection segments and the plurality of second connection segments. Layout positions of the first connection segments and the second connection segments extending along the first direction may be arranged more flexibly, thereby relieving the problem of the poor symmetry of the viewing angle caused by uneven anodes when the connection wirings are arranged in the display area to achieve the narrow frame in related art.

REFERENCE NUMBERS

100, display panel; 100*a*, display area; 100*a1*, connection wiring area; 100*a*2, compensation grid pattern area; 100*a*3, corner compensation area; 100*b*, non-display area; 100*c*, bonding area;

11, data line;

20, connection wiring; 21, first connection line; 211, first connection segment; 212, second connection segment; 213, third connection segment; 214, fourth connection segment;

22, second connection line; 221, fifth connection segment; 222, sixth connection segment;

30, base layer; 31, first metal layer; 311, power signal line; 32, second metal layer; 33, semiconductor layer; 34, gate metal layer; 35, electrode plate metal layer; 36, source-drain metal layer;

37, light-emitting element layer; 371, anode layer; 372, anode; 373, light-emitting layer; 374, cathode layer;

40, driving element; 41, metal compensation pattern; 42, compensation grid pattern; 421, metal grid; 422, first grid line; 423, second grid line; 424, grid opening;

51, first insulation layer; 52, second insulation layer, 53, third insulation layer; 54, fourth insulation layer;

55, fifth insulation layer; 56, sixth insulation layer; 57, pixel definition layer; 571, pixel opening; 572, connection opening;

61, bridge structure; 62, fanout connection line; 63, first connection part; 64, second connection part;

x, first direction; y, second direction;

G1, first gap; G2, second gap; G3, third gap; G4, fourth gap.

EMBODIMENTS OF THE INVENTION

The technical solutions in the embodiments of the present disclosure will be clearly and completely described below with reference to the accompanying drawings in the embodiments of the present disclosure. Obviously, the described embodiments are only some of the embodiments of the present disclosure, but not all of the embodiments. Based on the embodiments of the present disclosure, all other embodiments obtained by those skilled in the art without making creative efforts fall within the protection scope of the present disclosure.

Figure 1:
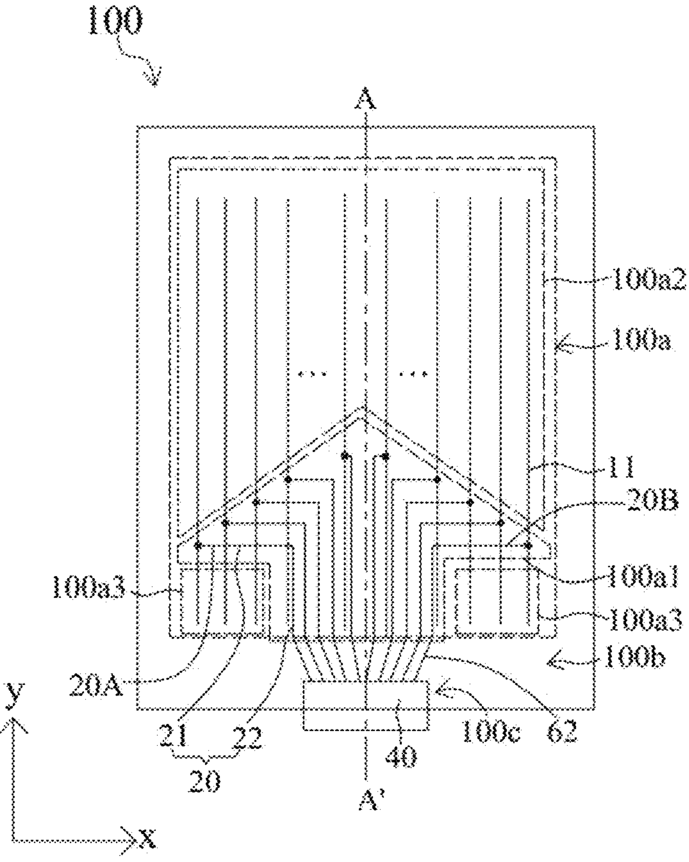
FIG. 1 is a schematic plan view of a display panel according to some embodiments of the present disclosure.
Figure 2:
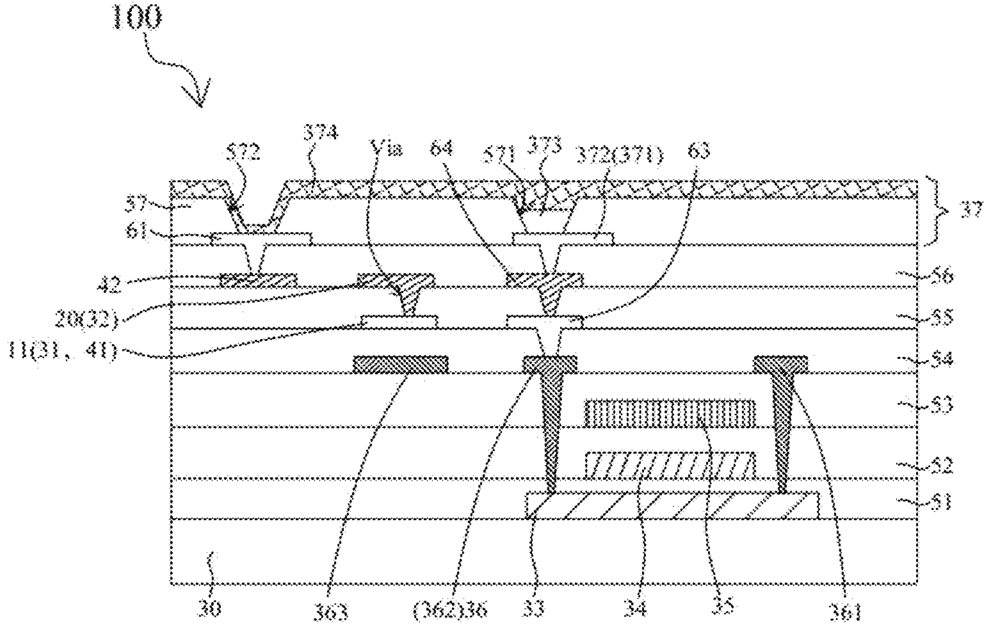
FIG. 2 is a schematic cross-sectional structural view of a display panel according to some embodiments of the present disclosure.

Referring to FIGS. 1 and 2, FIG. 1 is a schematic plan view of a display panel according to some embodiments of the present disclosure, and FIG. 2 is a schematic cross-sectional structural view of a display panel according to some embodiments of the present disclosure.

Referring to FIG. 1, the display panel 100 has a display area 100*a* and a non-display area 100*b* located outside the display area 100*a*. The non-display area 100*b* includes a bonding area 100*c* located on a side of the display area 100*a*.

The display panel 100 includes a driving element 40 bound to the bonding area 100*c*. The driving element 40 is configured to output data signals, and the driving element 40 may be any one of a driving chip and a chip-on-film (COF).

The display panel 100 also includes a plurality of data lines 11 arranged at intervals in the display area 100*a* and a plurality of connection wirings 20 arranged at intervals in the display area 100*a*. Each connection wiring 20 is connected between one data line 11 and the driving element 40 to transmit the data signal output by the driving element 40 to the corresponding data line 11. The plurality of connection wirings 20 are bent and arranged in the display area 100*a*, so that the plurality of connection wirings 20 are respectively connected to the plurality of data lines 11 one-to-one. Each connection wiring 20 includes a first connection line 21 and a second connection line 22 connected with each other. The second connection line 22 is bent relative to the first connection line 21, that is, the second connection line 22 intersects and is connected to the first connection line 21. Each first connection line 21 is connected between one second connection line 22 and one data line 11.

The display panel 100 is arranged symmetrically about a symmetry line AA' in a first direction x. The symmetry line AA' is an imaginary symmetry line. The plurality of connection wirings 20 are disposed on opposite sides of the symmetry line AA, and the plurality of connection wirings 20 are also symmetrically disposed about the symmetry line AA'. For example, a connection wiring 20A and a connection wiring 20B are arranged symmetrically about the symmetry line AA'.

The display panel 100 also includes a plurality of fanout connection lines 62 disposed in the non-display area 100*b*. The plurality of fanout connection lines 62 are located between the driving element 40 and the display area 100*a*, and are fanned out. Each fanout connection line 62 connects one connection wiring 20 and the driving element 40.

It should be noted that the plurality of connection wirings 20 are bent and arranged in the display area 100*a*, so that the plurality of fanout connection lines 62 occupy a smaller area in the non-display area 100*b*, so that the display panel 100 may achieve narrow-frame display.

Referring to FIG. 2, the display panel 100 includes a base layer 30, a first metal layer 31, a second metal layer 32, and a light-emitting element layer 37.

The first metal layer 31 is disposed on the base layer 30 and includes a plurality of data lines 11. The first metal layer 31 may also include a power signal line and a connection portion. The plurality of data lines 11 are spaced apart from the power signal line and the connection portion.

The second metal layer 32 is disposed on the base layer 30 and is insulated from the first metal layer 31. The second metal layer 32 includes the plurality of connection wirings 20. Thus, the plurality of connection wirings 20 are located in the same metal layer, which improves the problem of uneven brightness caused by the need for changeover holes for connection when one connection wiring 20 is located on different conductive layers.

The light-emitting element layer 37 is disposed on sides of the first metal layer 31 and the second metal layer 32 away from the base layer 30. The light-emitting element layer 37 includes an anode layer 371, light-emitting layers 373, and a cathode layer 374. The light-emitting layers 373 are provided between the anode layer 371 and the cathode layer 374. The anode layer 371 is located on a side of the light-emitting layers 373 close to the base layer 30, and the anode layer 371 includes a plurality of anodes 372 arranged at intervals. The light-emitting layer 373 may include an organic light-emitting layer 373, a quantum dot light-emitting film, and the like. A material of the anode layer 371 includes at least one of metal and transparent conductive material. A material of the cathode layer 374 includes at least one of metal and transparent conductive material.

Figure 3:
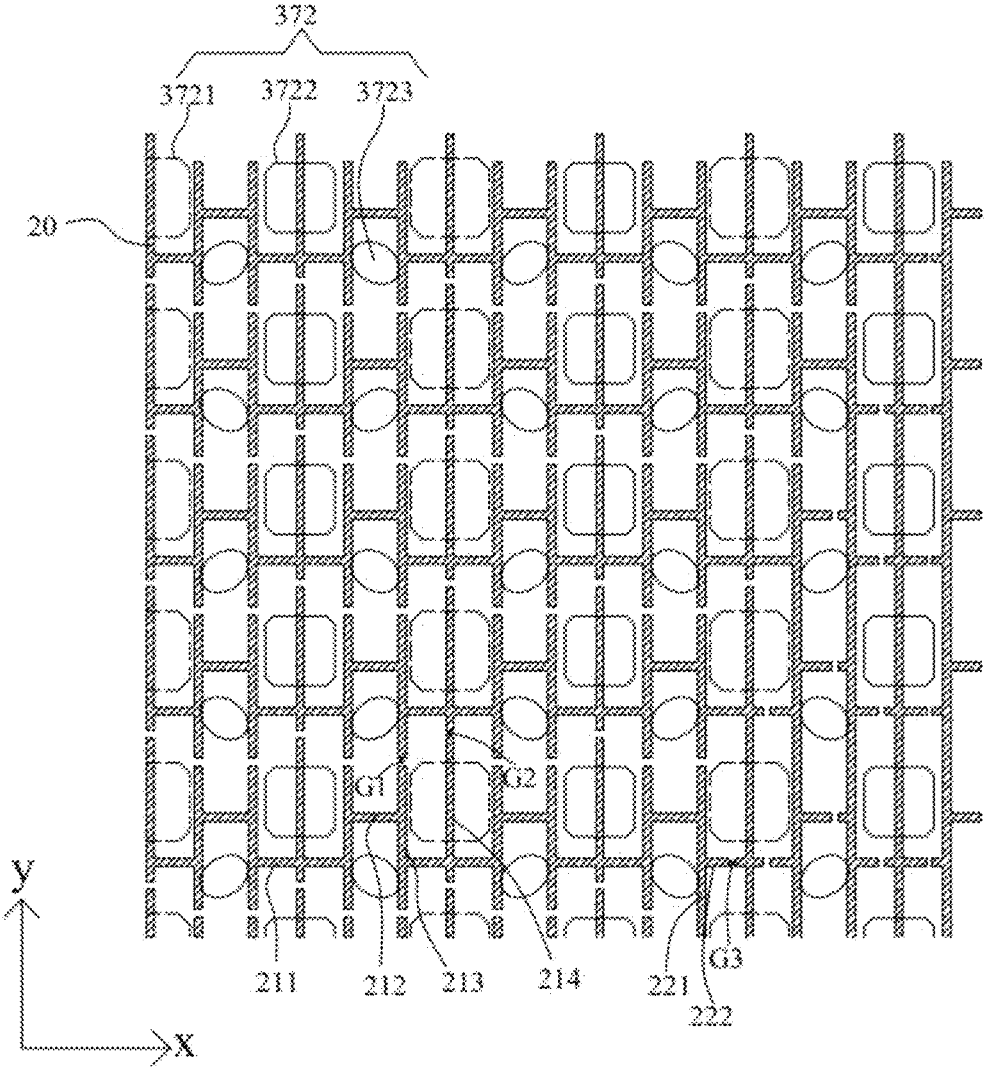
FIG. 3 is a partial enlarged schematic view of a display area according to some embodiments of the present disclosure.

Referring to FIG. 3, which is a partial enlarged schematic view of the display area according to some embodiments of the present disclosure. The plurality of anodes 372 includes first anodes 3721, second anodes 3722, and third anodes 3723 arranged at intervals.

It should be noted that since the light-emitting layer 373 is located on the anode layer 371, a flatness of the anode layer 371 may affect a flatness of the light-emitting layer 373. The anode layer 371 is uneven, which may cause the light-emitting layer 373 to be uneven. The unevenness of the light-emitting layer 373 may cause the problem of poor symmetry of the viewing angle when the display panel 100 is displayed, that is, the display effect of the display panel 100 may be different at symmetrical viewing angles of the display panel 100. Moreover, film layers below the anode layer 371 have an impact on the flatness of the plurality of anodes 372. For example, the first metal layer 31 and the second metal layer 32 are both located below the anode layer 371, and they affect the flatness of the plurality of anodes 372.

The light-emitting element layer 37 includes a plurality of subpixels, and each subpixel includes one light-emitting layer. The plurality of subpixels include red subpixels, blue subpixels, and green subpixels. One pixel may include a blue subpixel or a green subpixel; or one pixel may include a red subpixel and a green subpixel, that is, multiple subpixels are arranged in a Pentile manner, but are not limited to this. The plurality of pixels are arranged along the first direction x and a second direction y.

Figure 4:
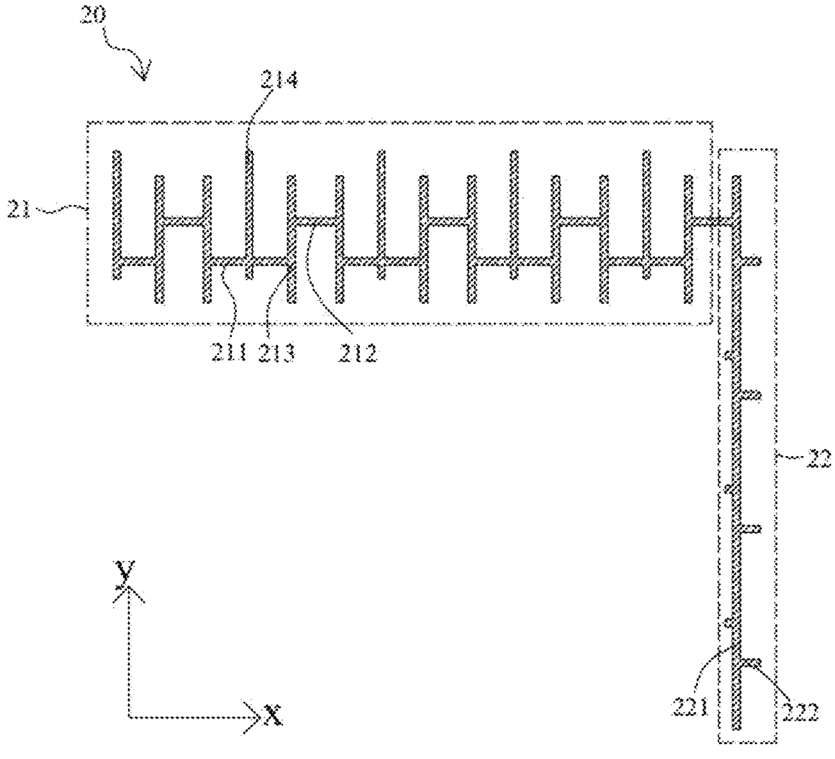
FIG. 4 is a partial structural view of one connection wiring in FIG. 3.

Referring to FIG. 3 and FIG. 4, FIG. 4 is a partial structural view of one connection wiring in FIG. 3.

There is at least one first connection line 21, which includes a plurality of first connection segments 211 each extending along the first direction x, a plurality of second connection segments 212 each extending along the first direction x, and a plurality of third connection segments 212 each extending along the second direction y. The plurality of first connection segments 211 and the plurality of second connection segments 212 are alternately and staggered along the first direction x. One first connection segment 211 and an adjacent one second connection segment 212 are connected to both sides of one same third connection segment 213 in the first direction x. The first direction x intersects the second direction y.

It should be noted that FIG. 3 illustrates several connection wirings 20 located on one side of the symmetry line AA. Since the plurality of connection wirings 20 are disposed on opposite sides of the symmetry line AA', the several connection wirings 20 located on the other side of the symmetry line AA' may be deduced based on FIG. 3, which will not be described again here.

In related art, when the connection wirings are arranged in the display area, the first connection line extends in a straight line, the probability of the first connection line overlapping the anode increases, and a risk of a large overlapping area between the first connection line and the anode also increases. The first connection line leads to an increased risk of causing unevenness in the anode.

In view of the shortcomings in the related art, in some embodiments of the present disclosure, the plurality of first connection segments 211 and the plurality of second connection segments 212 are alternately and staggered along the first direction x. Layout positions of the first connection segments 211 and the second connection segments 212 extending along the first direction may be arranged more flexibly, which is conducive to the first connection segments 211 and the second connection segments 212 to avoiding the anodes 372, thereby relieving the problem of the poor symmetry of the viewing angle caused by uneven anodes when the connection wirings are arranged in the display area to achieve the narrow frame in the related art. Furthermore, one first connection segment 211 and an adjacent one second connection segment 212 are connected to both sides of the same one third connection segment 213 in the first direction x, which realizes connections between the plurality of first connection segments 211 and the plurality of second connection segments 212. In addition, a design of the first connection line 21 including the plurality of first connection segments 211, the plurality of second connection segments 212, and the plurality of third connection segments 213 makes a metal layout area of the first connection line 21 larger. Thus, the connection wiring 20 has a larger and more uniform metal layout area, which may relieve the problem of uneven brightness caused by uneven metal distribution of the display panel 100 when the display panel 100 is in a screen-off state.

The plurality of first connection segments 211 of the same one first connection line 21 are aligned along the first direction x, the plurality of second connection segments 212 of the same one first connection line 21 are aligned along the first direction x, and the plurality of third connection segments 213 of the same one first connection line 2 are aligned along the first direction x.

In some embodiments, as illustrated in FIG. 3 and FIG. 4, the plurality of first connection segments 211 and the plurality of second connection segments 212 are alternately arranged one-to-one along the first direction x, but are not limited thereto. Two adjacent and connected first connection segments 211 and one second connection segment 212 may also be arranged as repeating units along the first direction x. One first connection segment 211 and two adjacent and connected second connection segments 212 may also be arranged as repeating units along the first direction x. Two adjacent and connected first connection segments 211 and two adjacent and connected second connection segments 212 may also be arranged as repeating units along the first direction x. A combination of the above solutions may also be arranged.

In other embodiments, the connection segments extending along the first direction x and misaligned, in addition to the design of the first connection segments 211 and the second connection segments 212, may also be three or more different connection segments misaligned along the first direction x, and there is at least one connection segment extending along the second direction y, which connects three or more different connection segments.

In some embodiments, when the first connection segment 211 and the adjacent second connection segment 212 are arranged to be misaligned, a vertical direction between the first connection segment 211 and the adjacent second connection segment 212 in the second direction y is less than or equal to a size of the third connection segment 213 along the second direction y. A ratio of the size of the third connection segment 213 along the second direction y to a size of the pixel of the display panel 100 along the second direction y may be n, where n is an integer greater than or equal to 1. For example, a ratio of the size of the pixel of the display panel 100 along the second direction to the size of the third connection segment 213 along the second direction y may be 1. Correspondingly, a space area in the second direction y occupied by the third connection segment 213 is the same as a space area in the second direction y occupied by an adjacent row of second anode 3722 and an adjacent row of third anode 3723, but is not limited thereto.

In some embodiments, there is at least one first connection segment 211 and at least one second connection segment 212, which have orthographic projections on the base layer 30 non-overlapping with orthographic projections of the plurality of anodes 372 on the base layer 30. There is at least one third connection segment 213, at least a portion of which has an orthographic projection on the base layer 30 non-overlapping with the orthographic projections of the plurality of anodes 372 on the base layer 30. Therefore, the risk of unevenness of the plurality of anodes 372 caused by at least part of the first connection segments 211, the second connection segments 212, and the third connection segments 213 is reduced, the risk of unevenness of the light-emitting layers 373 is reduced, and the symmetry of the viewing angle is improved when the connection wirings 20 are arranged in the display area 100*a*.

In some embodiments, orthographic projections of the plurality of first connection segments 211 on the base layer 30 do not overlap with the orthographic projections of the plurality of anodes 372 on the base layer 30, that is, all of the first connection segments 211 do not overlap with the plurality of anodes 372. In some embodiments, the orthographic projections of part of the first connection segments 211 on the base layer 30 may not overlap with the orthographic projections of the plurality of anodes 372 on the base layer 30, and orthographic projections of the other part of the first connection segments 211 on the base layer 30 may overlaps with the orthographic projection of at least one anode 372 on base layer 30. In some embodiments, for the first connection segments 211 overlapping the anodes 372, each first connection segment 211 includes a first portion and a second portion, and an orthographic projection of the first portion on the base layer 30 does not overlap with the orthographic projections of the plurality of anodes 372 on the base layer 30, and an orthographic projection of the second portion on the base layer 30 overlap with the orthographic projections of the plurality of anodes 372 on the base layer 30. An area of the second portion is less than an area of the first portion.

In some embodiments, the orthographic projections of the plurality of second connection segments 212 on the base layer 30 may not overlap with the orthographic projections of the plurality of anodes 372 on the base layer 30, that is, all of the second connection segments 212 do not overlap with the plurality of anodes 372. In some embodiments, the orthographic projections of part of the second connection segments 212 on the base layer 30 may not overlap with the orthographic projections of the plurality of anodes 372 on the base layer 30, and orthographic projections of the other part of the second connection segments 212 on the base layer 30 may overlap with the orthographic projection of at least one anode 372 on base layer 30.

It should be noted that the design of the plurality of first connection segments 211 and the plurality of second connection segments 212 of the connection wiring 20 misaligning the plurality of anodes 372 may better ensure the symmetry of the viewing angle when the display panel 100 is displayed. However, in the actual process, due to the influence of process accuracy, etc., the first connection segment 211 and the second connection segment 212 may each have a portion overlapping the anodes 372, but most portion of the first connection segment 211 and most portion of the second connection segment 212 may still avoid the anodes 372.

In some embodiments, there is at least one third connection segment 213, which has an orthographic projection on the base layer 30 non-overlapping with the orthographic projections of the plurality of anodes 372 on the base layer 30. In some embodiments, the orthographic projections of the plurality of third connection segments 213 on the base layer 30 do not overlap with the orthographic projections of the plurality of anodes 372 on the base layer 30. In some embodiments, for the third connection segments 213 overlapping with the anodes 372, each third connection segment 213 includes a third portion and a fourth portion, an orthographic projection of the third portion on the base layer 30 does not overlap with the orthographic projections of the plurality of anodes on the base layer 30, and an orthographic projection of the fourth portion on the base layer 30 overlaps with the orthographic projections of the plurality of anodes 372 on the base layer 30. An area of the fourth portion is less than an area of the third portion.

It should be noted that in the present disclosure, a projected direction of the orthographic projection is the direction in which the light-emitting element layer 37 points to the base layer 30.

In some embodiments, as illustrated in FIG. 3 and FIG. 4, the first connection segments 211, the second connection segments 212, and the third connection segments 213 may all extend in a straight line. This arrangement reduces a patterning process of forming the first connection lines 21.

In other embodiments, at least one of the first of connection segment 211, the second connection segment 212, and the third connection segment 213 may also include at least one of a polygonal segment and an arc segment. In this way, the at least one of the first of connection segment 211, the second connection segment 212, and the third connection segment 213 may better avoid the plurality of anodes 372.

In some embodiments, the third connection segment 213 includes first and second ends opposite in the second direction y. The first connection segment 211 and the second connection segment 212 may both be connected between the first end and the second end of the third connection segment 213. Therefore, the first end and the second end of the third connection segment 213 are both unconnected ends, that is, they are not connected to other structures. It can be understood that the third connection segment 213 may also include more than two ends, for example, three ends.

In the present disclosure, a meaning of the unconnected end is relative to a meaning of a connected end. The connected end is connected to other structures, while the unconnected end refers to an end that is not connected to other structures, and the unconnected end is suspended.

In other embodiments, one of the first connection segment 211 and the second connection segment 212 may be connected to one of the first end and the second end of the third connection segment 213, and the other one of the first connection segment 211 and the second connection segment 212 may be connected between the first end and the second end of the third connection segment 213. At this time, the other one of the first end and the second end of the third connection segment 213 is an unconnected end. In some embodiments, the first connection segment 211 and the second connection segment 212 may be connected to the first end and the second end of the third connection segment 213, respectively.

In some embodiments, there is at least one first connection line 21, which further includes a plurality of fourth connection segments 214 extending along the second direction y. The plurality of fourth connection segments 214 of the same one first connection line 21 are aligned along the first direction x. Each fourth connection segment 214 is located between two adjacent third connection segments 213. The plurality of fourth connection segments 214 and the plurality of third connection segments 213 are staggered along the first direction x. Each fourth connection segment 214 is connected to one first connection segment 211 or one second connection segment 212.

In some embodiments of the present disclosure, on the basis of designing the first connection segments 211, the second connection segments 212, and the third connection segments 213, the plurality of fourth connection segments are added and misaligned with the third connection segments 213. The ends of the third connection segment 213 and ends of the fourth connection segment 214 are disposed in a staggered manner, and gaps adjacent to the ends of the third connection segment 213 and the ends of the fourth connection segment 214 may also be disposed in a staggered manner. Thus, a distribution irregularity of the gaps between different connection wirings 20 in the second metal layer 32 increases. A risk of obvious dark lines appearing on the display panel 100 in the screen-off state is reduced, thereby improving the problem of uneven brightness of the display panel 100 in the screen-off state.

It should be noted that the plurality of connection wirings 20 are formed by removing part of the entire initial metal layer, and the remaining metal forms the plurality of spaced connection wirings 20. The second metal layer 32 has no metal in the gaps adjacent to the ends of the connection segments. When the display panel 100 is in the screen-off state, a reflectivity of an area corresponding to the gaps is low, and a reflectivity of an area corresponding to the connection wirings 20 is high. By increasing the distribution irregularity of the gaps, the gaps are not in a straight line, which may reduce the risk of obvious dark lines, thereby improving the problem of uneven linear brightness (i.e. linear mura).

In some embodiments, each first connection line 21 includes the plurality of fourth connection segments 214 extending along the second direction y.

In some embodiments, as illustrated in FIG. 3 and FIG. 4, the plurality of fourth connection segments 214 each extends in a straight line to further reduce the difficulty of the patterning process of forming the first connection line 21. The plurality of fourth connection segments 214 may also include polyline segments and/or arc segments.

In some embodiments, the fourth connection segment 214 includes first and second ends that are opposite in the second direction y. The fourth connection segment 214 is connected to a position between two ends of one first connection segment 211, or the fourth connection segment 214 is connected to a position between two ends of one second connection segment 212. Therefore, both the first end and the second end of the fourth connection segment 214 are unconnected ends, that is, they are not connected to other structures. It can be understood that the fourth connection segment 214 may also include more than two ends, for example, include three ends. Because the fourth connection segment 214 and the third connection segment 213 are misaligned, the two unconnected ends of the fourth connection segment 214 and the two unconnected ends of the third connection segment 213 are also misaligned.

In some embodiments, there is at least one fourth connection segment 214, which has an orthographic projection on the base layer 30 overlaps with the orthographic projection of at least one anode 372 on the base layer 30.

In a specific embodiment, there is at least one anode 372, which has the orthographic projection on the base layer 30 symmetrical with respect to the orthographic projection of one fourth connection segment 214 on the base layer 30. In this arrangement, when the orthographic projection of the fourth connection segment 214 on the base layer 30 overlaps with the orthographic projection of the at least one anode 372 on the base layer 30, the at least one anode 372 is symmetrically arranged with respect to one fourth connection segment 214, so that It can also be ensured that the light-emitting effect of the light emitted by the light-emitting layer 373 on the anode 372 at symmetrical viewing angles is the same or tends to be the same, thereby ensuring the symmetry of the viewing angle when the display panel 100 is displayed.

It should be noted that the introduction of the fourth connection segments 214 in the present disclosure is intended to relieve the problem of linear mura. However, due to the arrangement of the plurality of anodes 372, the gaps between the plurality of anodes 372 are limited. On a condition that the fourth connection segments 214 may overlap with the anodes 372, the orthographic projection of the anode 372 on the base layer 30 is symmetrically arranged with respect to the orthographic projection of the fourth connection segment 214 on the base layer 30, which may ensure the symmetry of the viewing angle when the display panel 100 is displayed. Therefore, the fourth connection segments 214 of some embodiments of the present disclosure may take into account both improvement of the linear mura and good symmetry of the viewing angle.

In other embodiments, if conditions permit, the orthographic projection of at least one fourth connection segment 214 on the base layer 30 may not overlap with the orthographic projections of the plurality of anodes 372 on the base layer 30.

In some embodiments, a length of the first connection segment 211 is greater than a length of the second connection segment 212, and the fourth connection segment 214 is connected to the first connection segment 211. This arrangement allows the plurality of fourth connection segments 214 and the plurality of third connection segments 213 to be evenly arranged in the first direction x when the first connection segment 211 is longer, which further improves the uniform distribution of metal in the second metal layer 32 and further relieves the problem of uneven brightness of the display panel 100 in the screen-off state.

In some embodiments, in the first direction x, in each connection wiring 20, a distance between the fourth connection segment 214 and one adjacent third connection segment 213 and a distance between the same fourth connection segment 214 and another adjacent third connection segment 213 are equal. In this arrangement, the plurality of fourth connection segments 214 and the plurality of third connection segments 213 may be more evenly arranged in the first direction x, which further improves the uniform distribution of metal in the second metal layer 32 and further relieves the problem of uneven brightness of the display panel 100 in the screen-off state.

In some embodiments, the plurality of first connection lines 21 of the plurality of connection wirings 20 are arranged along the second direction y. There are at least two adjacent first connection lines 21, each of which includes the plurality of first connection segments 211, the plurality of second connection segments 212, the plurality of third connection segments 213, and the plurality of fourth connection segments 214. In a specific embodiment, as illustrated in FIG. 3 and FIG. 4, the first connection line 21 of each connection wiring 20 includes the plurality of first connection segments 211, the plurality of second connection segments 212, the plurality of third connection segments 213, and the plurality of fourth connection segments 214. In this arrangement, a part design of the structures of the plurality of connection wirings 20 is the same, which is beneficial to simplifying the manufacturing process of the plurality of connection wirings 20.

On a condition that the first connection line 21 of each connection wiring 20 includes the plurality of first connection segments 211, the plurality of second connection segments 212, the plurality of third connection segments 213, and the plurality of fourth connection segments 214, for two adjacent first connection lines 21, the plurality of first connection segments 211 of one first connection line 21 and the plurality of first connection segments 211 of another first connection line 21 may be aligned in a one-to-one manner along the second direction y. Similarly, for two adjacent first connection lines 21, the plurality of second connection segments 212 of one first connection line 21 and the plurality of second connection segments 212 of another first connection line 21 may be aligned in a one-to-one manner along the second direction y; the plurality of third connection segments 213 of one first connection line 21 and the plurality of third connection segments 213 of another first connection line 21 may be aligned in a one-to-one manner along the second direction y; the plurality of fourth connection segments 214 of one first connection line 21 and the plurality of fourth connection segments 214 of another first connection line 21 may be aligned in a one-to-one manner along the second direction y. In this arrangement, the manufacturing process of the first connection lines 21 of the plurality of connection wirings 20 is further simplified.

As illustrated in FIG. 3, there is a first gap G1 between two adjacent third connection segments 213 of at least two adjacent first connection lines 21 that are aligned along the second direction y. There is a second gap G2 between two adjacent fourth connection segments 214 of at least two adjacent first connection lines 21 that are aligned along the second direction y. The first gap G1 and the second gap G2 are misaligned along the first direction x. In this way, the problem of linear mura caused by a linear arrangement of multiple gaps is relieved, thereby improving the problem of uneven brightness of the display panel 100 in the screen-off state.

It should be noted that when both ends of the third connection segment 213 are unconnected ends, the first gap G1 is located between two unconnected ends of two adjacent third connection segments 213 arranged in alignment along the second direction y.

In some embodiments, a size of the first gap G1 and a size of the second gap G2 along the second direction y range between 1.8 microns and 3.5 microns. Optionally, the size of the first gap G1 and the size of the second gap G2 along the second direction y range between 2 microns and 3 microns. When the size of the first gap G1 and the size of the second gap G2 along the second direction y are less than 1.8 microns, the process difficulty of forming the first gap G1 and the second gap G2 may be increased, and a risk of a short circuit between two adjacent first connection lines 21 may be increased. When the size of the first gap G1 and the size of the second gap G2 along the second direction y are greater than 3.5 microns, the size of the first gap G1 and the size of the second gap G2 are too large, and there is a large difference between a reflectivity of an area corresponding to the first gap G1, two third connection segments 213 adjacent to the first gap G1 in the second direction y, the second gap G2, and two fourth connection segments 214 adjacent to the second gap G2 in the second direction y and a reflectivity of an area provided with continuous connection lines, which increases the risk of uneven brightness of the display panel 100 in the screen-off state.

In some embodiments, there is at least one second connection line 22, which includes a fifth connection segment 221 extending along the second direction y and a plurality of sixth connection segments 222 each extending along the first direction x. The fifth connection segment 221 is located on a side of the first connection line 21 away from the data line 11 connected to the first connection line 21. The fifth connection segment 221 is connected to one first connection segment 211 or one second connection segment 212. The plurality of six connection segments 222 are connected to the fifth connection segment 221.

It should be noted that designs of the first connection line 21 and the second connection line 22 are not completely same, partly because layout spaces of the first connection line 21 and the second connection line 22 are different. In some embodiments, the second connection line 22 may also adopt the design of the first connection line 21.

In some embodiments, as illustrated in FIG. 3 and FIG. 4, a plurality of second connection lines 22 of the plurality of connection wirings 20 are arranged along the first direction x. There are at least two adjacent second connection lines 22, each of which includes the fifth connection segment 221 and the plurality of sixth connection segments 222. There is a third gap G3 between two adjacent sixth connection segments 222 of at least two adjacent second connection lines 22 that are aligned along the first direction x. The third gap G3 is misaligned with the first gap G1 and the second gap G2 along the first direction x. This arrangement may further relieve the problem of linear mura caused by the linear arrangement of multiple gaps, thereby improving problem of uneven brightness of the display panel 100 in the screen-off state. In a specific embodiment, each second connection line 22 includes the fifth connection segment 221 and the plurality of sixth connection segments 222.

In some embodiments of the present disclosure, for each connection wiring 20, the data signal output by the driving element 40 is transferred to one first connection segment 211 or one second connection segment 212 connected to the fifth connection segment 221 by passing through the fifth connection segment 221 extending along the second direction y and the plurality of sixth connection segments 222 extending along the first direction x, and then transmitted to the data line 11 by passing through the plurality of first connection segments 211 and the plurality of second connection segments 212 connected through the third connection segments 213 and the fourth connection segments 214. Therefore, the above-mentioned first connection segments 211 to the sixth connection segments 222 as a whole realize the transmission of the data signal from the driving element 40 to the data line 11.

In some embodiments, the plurality of sixth connection segments 222 are connected to both sides of the fifth connection segment 221 in the first direction x, but are not limited thereto. Lengths of the sixth connection segments 222 located on the same side of the fifth connection segment 221 may be the same or different. The sixth connection segment 222 includes first and second ends opposite in the first direction x. At least one of the first end and the second end of the sixth connection segment 222 is an unconnected end. In a specific embodiment, as illustrated in FIG. 3 and FIG. 4, the first end of the sixth connection segment 222 is a connected end connected to the fifth connection segment 221, and the second end of the sixth connection segment 222 is the unconnected end. In the first direction x, the gap between the second ends of two adjacent sixth connection segments 222 is the third gap G3.

In some embodiments, there is a fourth gap G4 between the fifth connection segment 221 and the third connection segment 213 or the fourth connection segment 214, where the third connection segment 213 or the fourth connection segment 214 is adjacent to and aligned with the fifth connection segment 221 in the second direction y. As illustrated in FIG. 4, there is a fourth gap G4 between the fifth connection segment 221 and the third connection segment 213, where the third connection segment 213 is adjacent to and aligned with the fifth connection segment 221 in the second direction y.

In some embodiments, a size of the fourth gap G4 along the second direction y ranges between 1.8 microns and 3.5 microns. Optionally, the size of the fourth gap G4 along the second direction y ranges between 2 microns and 3 microns. A size of the third gap G3 along the first direction x ranges between 1.8 microns and 3.5 microns. Optionally, the size of the third gap G3 along the first direction x ranges between 2 microns and 3 microns. The reasons for designing the sizes of the third gap G3 and the fourth gap G4 are the same as those of the first gap G1 and the second gap G2, and will not be described again here.

In some embodiments, there is at least one of the first gap G1, the second gap G2, the third gap G3, and the fourth gap G4, which has the orthographic projection on the base layer 30 non-overlapping with the orthographic projections of the plurality of anodes 372 on the base layer 30. In a specific embodiment, the orthographic projections of the first gaps G1, the second gaps G2, the fourth gaps G4, and the third gaps G3 on the base layer 30 do not overlap with the orthographic projections of the plurality of anodes 372 on the base layer 30. In this arrangement, the risk of unevenness of the anode 372 caused by of the gap and the unconnected ends adjacent to the gap is reduced, which reduces the risk of unevenness of the light-emitting layer 373, thereby ensuring the symmetry of the viewing angle of the display panel 100.

Figure 5:
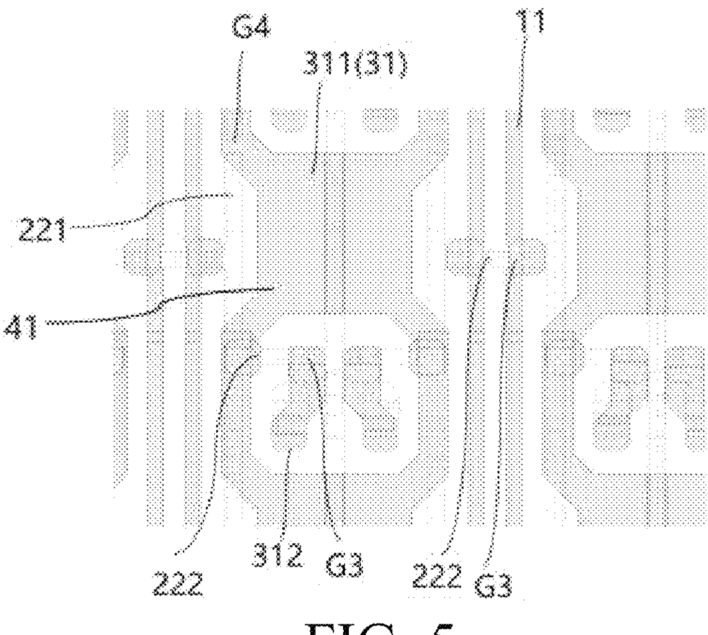
FIG. 5 is a partial enlarged schematic view of a display area according to some embodiments of the present disclosure.

In some embodiments, as illustrated in FIG. 5, the display panel 100 further includes metal compensation patterns 41. An orthographic projection of the metal compensation pattern 41 on the base layer 30 overlaps with an orthographic projection of at least one of the first gap G1, the second gap G2, the fourth gap G4, and the third gap G3 on the base layer 30. In this arrangement, when the display panel 100 is in the screen-off state, the metal compensation patterns 41 increase the reflectivity at the gaps, further reducing the risk of obvious dark lines appearing on the display panel 100 in the screen-off state. Thus, the problem of uneven brightness of the display panel 100 in the screen-off state is improved.

In some embodiments, the first metal layer 31 includes the metal compensation patterns 41. This arrangement allows the first metal layer 31 to be configured to compensate for the reflectivity at the gaps, thereby avoiding the need to add a new metal layer to compensate for the reflectivity at the gaps. The problem of uneven brightness of the display panel 100 in the screen-off state, and the manufacturing process of the display panel 100 is simplified.

In some embodiments, as illustrated in FIG. 5, the metal compensation pattern 41 may be at least one of the data line 11, the power signal line 311, and a connecting line 312.

In a specific embodiment, the metal compensation pattern 41 may include the power signal line 311, because the power signal line 311 is a metal wiring that occupies a relatively large area in the second metal layer 32. The use of the power signal line 311 may better meet the requirements for the reflectivity compensation at the gaps at different locations.

In another specific embodiment, the metal compensation pattern 41 may include the data line 11, the power signal line 311, and the connecting line 312, that is, the metal compensation pattern 41 includes multiple different types of wirings. In this way, a selectivity of the metal compensation pattern 41 is increased, which may increase the flexibility of the layout positions of the first gap G1, the second gap G2, the fourth gap G4, and the third gap G3.

In some embodiments, other metal layers between the second metal layer 32 and the base layer 30 may also be used, a metal layer above the second metal layer 32 may also be used, or a metal layer may be added above the second metal layer 32, as the metal compensation patterns. In some embodiments, the anode layer 371, and a gate metal layer 34, an electrode plate metal layer 35, and a source-drain metal layer 36 below may include the metal compensation patterns 41.

In some embodiments, the metal compensation pattern 41 and the second metal layer 32 include the same material. This arrangement enables the metal compensation pattern 41 and the second metal layer 32 to have the same reflectivity. In some embodiments, the materials of the metal compensation pattern 41 and the second metal layer 32 include at least one of copper, molybdenum, aluminum, and titanium.

In some embodiments, as illustrated in FIG. 2, the display panel 100 further includes an insulation layer, which is disposed between the first metal layer 31 and the second metal layer 32 and includes a plurality of via holes Via. The plurality of connection wirings 20 are connected to the plurality of data lines 11 respectively through the plurality of via holes Via. Orthographic projections of the plurality of via holes Via on the base layer 30 and the orthographic projections of the plurality of anodes 372 on the base layer 30 are arranged in a staggered manner. In this arrangement, the risk of unevenness of the plurality of anodes 372 caused by unevenness of film layers caused by the plurality of via holes Via is reduced, which reduces the risk of unevenness of the light-emitting layer 373, thus ensuring the symmetry of the viewing angle when the display panel 100 is displayed.

In some embodiments, the plurality of data lines 11 extend along the second direction x. Therefore, an extending direction of the third connection segment 213 and an extending direction of the fourth connection segment 214 are the same as an extending direction of the data line 11, and the third connection segment 213 and the fourth connection segment 214 may occupy a larger space area in the second direction y. An extending direction of the first connection segment 211 and an extending direction of the second connection segment 212 intersect the extending direction of the data line 11. A design of sizes of the first connection segment 211 and the second connection segment 212 may be adapted to a smaller space area in the first direction x.

In some embodiments, as illustrated in FIG. 3 and FIG. 4, the first direction x and the second direction y are perpendicular to each other, but are not limited thereto. The first direction x is a width direction of the display panel 100, and the second direction y is a length direction of the display panel 100, which are not limited here.

In other embodiments, the first direction x and the second direction y may also intersect the extending direction of the data line 11. For example, an angle between the second direction y and the extending direction of the data line 11 is an acute angle or an obtuse angle.

Figure 6:
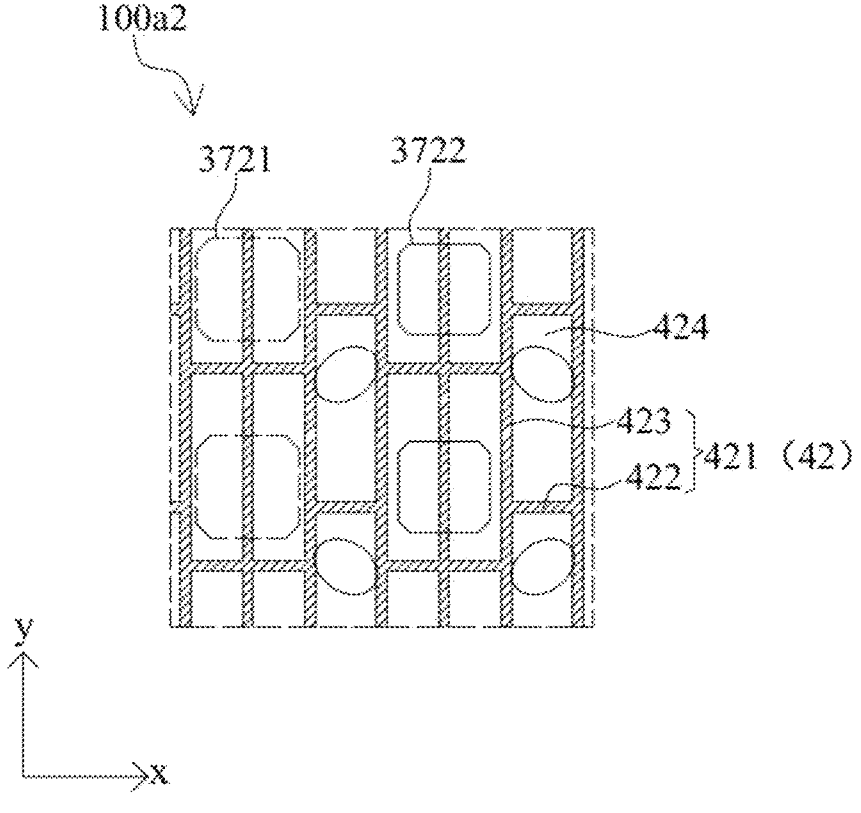
FIG. 6 is a partial enlarged schematic view of a compensation grid pattern area illustrated in FIG. 1.

In some embodiments, as illustrated in FIG. 1 and FIG. 6, the plurality of connection wirings 20 are located in a local area of the display area 100*a*, that is, the plurality of connection wirings 20 are located in a connection wiring area 100*al*. In order to improve the distribution uniformity of the metal in the display area 100*a*, the second metal layer 32 also includes a compensation grid pattern 42 located in the display area 100*a*. The compensation grid pattern 42 is located in a compensation grid pattern area 100*a*2. The compensation grid pattern area 100*a*2 is arranged adjacent to the connection wiring area 100*al* and is located on a side of the connection wiring area 100*al* away from the driving element 40. The compensation grid pattern 42 is located on a side of the plurality of connection wirings 20 away from the bonding area 100*c*. The compensation grid pattern 42 includes a plurality of interconnected metal grids 421, and each metal grid 421 is arranged around a grid opening 424. In this arrangement, the design of the compensation grid pattern 42 may, on the one hand, improve the distribution uniformity of the metal of the compensation grid pattern 42, and on the other hand, improve the similarity between the compensation grid pattern 42 and the plurality of connection wirings 20, so that the reflectivity of an area corresponding to the compensation grid pattern and the reflectivity of an area corresponding to the plurality of connection wirings 20 are tend to be the same, which further improves the problem of uneven brightness of the display panel 100 in the screen-off state.

In some embodiments, the metal grid 421 is rectangular, but is not limited thereto. Each metal grid 421 includes first grid lines 422 each extending along the first direction x and second grid lines 423 each extending along the second direction y. The first grid lines 422 are connected to the second grid lines 423. In a specific embodiment, the metal grid 421 includes two parallel and opposite first grid lines 422 and two parallel and opposite second grid lines 423. Each first grid line 422 connects two adjacent second grid lines 423.

It should be noted that due to the special design of the plurality of connection wirings 20 in the present disclosure, the structure of the plurality of connection wirings 20 is similar to the structure of the compensation grid pattern 42, so that the distribution uniformity of the metal of the second metal layer 32 is significantly improved. The connection wirings 20 are provided in the display area 100*a*, so that the display panel 100 may achieve a narrow frame and improve the problem of uneven brightness of the display panel 100 in the screen-off state.

In some embodiments, as illustrated in FIG. 1, the display area 100*a* also includes two corner compensation areas 100*a*3 located at two corners of the display area 100*a*. The second metal layer may also include corner compensation grid patterns (not shown) located at the corner compensation areas 100*a*3. A design of the corner compensation grid pattern may be the same as the design of the compensation grid pattern 42. The corner compensation areas 100*a*3 are located on a side of the compensation grid pattern area 100*a*2 close to the bonding area 100*c*. In this way, the problem of uneven brightness of the display panel in the screen-off state may be further improved.

In some embodiments, as illustrated in FIG. 2, the anode layer 371 also includes a bridge structure 61 located in the non-display area 100*b*. The bridge structure 61 bridges the cathode layer 374 and the compensation grid pattern 42, so that the cathode layer 374 is connected to the compensation grid pattern 42. In this way, a resistance drop of a constant voltage signal required by the cathode layer 374 is reduced during transmission, thereby reducing a power consumption required by the display panel 100 for display. Furthermore, the design of the plurality of metal grids 421 of the compensation grid pattern 42 may significantly reduce the resistance drop of the constant voltage signal during transmission.

In some embodiments, as illustrated in FIG. 2, the display panel 100 further includes a semiconductor layer 33, the gate metal layer 34, and the source-drain metal layer 36. The display panel 100 may further include the electrode plate metal layer 35.

The semiconductor layer 33 is disposed on the base layer 30 and includes an active layer.

The gate metal layer 34 is located on a side of the semiconductor layer 33 away from the base layer 30. The gate metal layer 34 includes gates, and orthographic projections of the gates on the base layer 30 overlap with an orthographic projection of the active layer on the base layer 30. A first insulation layer 51 is provided between the semiconductor layer 33 and the gate metal layer 34.

The electrode plate metal layer 35 is located on a side of the gate metal layer 34 away from the base layer 30. A second insulation layer 52 is provided between the electrode plate metal layer 35 and the gate metal layer 34. The electrode plate metal layer 35 also includes electrode plates, and an orthographic projection of the electrode plate on the base layer 30 overlaps with the orthographic projection of the gate on the base layer 30. The electrode plate and the gate are two plates of a capacitor.

The source-drain metal layer 36 is located on a side of the electrode plate metal layer 35 away from the base layer 30. A third insulation layer 53 is provided between the source-drain metal layer 36 and the electrode plate metal layer 35. The source-drain metal layer 36 includes sources 361, drains 362, and an initialization signal grid pattern 363 arranged at intervals. The sources 361 and the drains 362 are connected to the active layer through via holes, where each of the via holes penetrates the third insulation layer 53, the second insulation layer 52, and the first insulation layer 51. The initialization signal grid pattern is located in the display area 100*a* and is configured to transmit an initialization signal.

The first metal layer 31 is located on a side of the source-drain metal layer 36 away from the base layer 30. A fourth insulation layer 54 is provided between the first metal layer 31 and the source-drain metal layer 36. The first metal layer 31 further includes a first connection part 63 connected to the drains 362 through via holes each penetrating the fourth insulation layer 54.

The second metal layer 32 is disposed on a side of the first metal layer 31 away from the base layer 30. The insulation layer between the second metal layer 32 and the first metal layer 31 is a fifth insulation layer 55. The second metal layer 32 also includes a second connection part 64 connected to the first connection part 63 through a via hole penetrating the fifth insulation layer 55.

A sixth insulation layer 56 is provided between the anode layer 371 and the second metal layer 32. The anodes 372 are connected to the second connection part 64 through via holes each penetrating the sixth insulation layer 56, so that a transistor including the source 361 and the drain 362 is connected to the anode 372.

A pixel definition layer 57 is provided on a side of the sixth insulation layer 56 away from the base layer 30. The pixel definition layer 57 includes pixel openings 571 located in the display area 100*a* and a connection opening 572 located in the non-display area 100*b*. The light-emitting layer 373 is located in the pixel opening 571 and on the anode 372. The cathode layer 374 is connected to the bridge structure 61 through the connection opening 572. The bridge structure 61 is connected to the compensation grid pattern 42 through a via hole penetrating the sixth insulation layer 56.

Figure 7:
FIG. 7 is a schematic structural view of a display device according to some embodiments of the present disclosure.

Based on the same inventive concept, as illustrated in FIG. 7, the present disclosure also provides display devices 200. The display device 200 includes any one of the display panels in the above embodiments. The display device 200 may be applied to smart mobile terminals, tablets, notebooks, etc.

The description of the above embodiments is only used to help understand the technical solutions and core ideas of the present disclosure. Those of ordinary skill in the art should understand: it is still possible to modify the technical solutions recorded in the foregoing embodiments, or to equivalently replace some of the technical features, but these modifications or substitutions do not cause the essence of the corresponding technical solutions to depart from the scope of the technical solutions of the embodiments of the present disclosure.

The invention claimed is:

1. A display panel, comprising a display area and a bonding area disposed outside the display area, and comprising:

a base layer;

a first metal layer, disposed on the base layer and comprising a plurality of data lines arranged in the display area; and a second metal layer, disposed on the base layer, insulated from the first metal layer, and comprising a plurality of connection wirings arranged in the display area and a compensation grid pattern arranged in the display area, wherein the plurality of connection wirings are arranged at intervals and respectively connected to the plurality of data lines, each of the connection wirings comprises a first connection line and a second connection line connected with each other, the second connection line is bent relative to the first connection line, and the first connection line is connected between the second connection line and one of the data lines;

wherein there is at least one first connection line of a plurality of first connection lines of the plurality of connection wirings, the at least one first connection line comprises a plurality of first connection segments each extending along a first direction, a plurality of second connection segments each extending along the first direction, and a plurality of third connection segments each extending along a second direction, the plurality of first connection segments and the plurality of second connection segments are alternately and staggered along the first direction, one first connection segment of the plurality of first connection segments and an adjacent one second connection segment of the plurality of second connection segments are connected to both sides of one of the plurality of third connection segments in the first direction, and the first direction intersects the second direction; and wherein the compensation grid pattern is disposed on a side of the plurality of connection wirings away from the bonding area, the compensation grid pattern comprises a plurality of interconnected metal grids, and each of the metal grids is arranged around a grid opening.

2. The display panel according to claim 1, further comprising:

a light-emitting element layer, disposed on sides of the first metal layer and the second metal layer away from the base layer, and comprising an anode layer, light-emitting layers, and a cathode layer, wherein the light-emitting layers are disposed between the anode layer and the cathode layer, the anode layer is located on a side of the light-emitting layers adjacent to the base layer and comprises a plurality of anodes arranged at intervals; and wherein there is at least one first connection segment of the plurality of first connection segments and at least one second connection segment of the plurality of second connection segments, orthographic projections of the at least one first connection segment and the at least one second connection segment on the base layer do not overlap with orthographic projections of the plurality of anodes on the base layer; and there is at least one third connection segment of the plurality of third connection segments, and an orthographic projection of a portion of the at least one third connection segment on the base layer does not overlap with the orthographic projections of the plurality of anodes on the base layer.

3. The display panel according to claim 2, wherein the at least one first connection line further comprises a plurality of fourth connection segments each extending along the second direction, each of the plurality of fourth connection segments is disposed between two adjacent ones of the plurality of third connection segments, the plurality of fourth connection segments and the plurality of third connection segments are staggered along the first direction, and each of the plurality of fourth connection segments is connected to one of the plurality of first connection segments or one of the plurality of second connection segments.

4. The display panel according to claim 3, wherein there is at least one fourth connection segment of the plurality of fourth connection segments, and an orthographic projection of the at least one fourth connection segment on the base layer overlaps with an orthographic projection of at least one anode of the plurality of anodes on the base layer.

5. The display panel according to claim 3, wherein a length of each of the first connection segments is greater than a length of each of the second connection segments, and each of the fourth connection segments is connected to one of the first connection segments.

6. The display panel according to claim 3, wherein the plurality of first connection lines of the plurality of connection wirings are arranged along the second direction;

there are at least two adjacent first connection lines of the plurality of first connection lines, each of the at least two adjacent first connection lines comprises the plurality of first connection segments, the plurality of second connection segments, the plurality of third connection segments, and the plurality of fourth connection segments; and there is a first gap between two adjacent third connection segments of the third connection segments of the at least two adjacent first connection lines, where the two adjacent third connection segments are aligned along the second direction; there is a second gap between two adjacent fourth connection segments of the fourth connection segments of the at least two adjacent first connection lines, where the two adjacent fourth connection segments are aligned along the second direction; and the first gap and the second gap are misaligned along the first direction.

7. The display panel according to claim 6, wherein there is at least one second connection line of a plurality of second connection lines of the plurality of connection wirings, and the at least one second connection line comprises a fifth connection segment extending along the second direction and a plurality of sixth connection segments each extending along the first direction, the fifth connection segment is disposed on a side of the first connection line away from the one of the data lines connected to the first connection line, the fifth connection segment is connected to one of the plurality of first connection segments or one of the plurality of second connection segments, and the plurality of sixth connection segments are connected to the fifth connection segment.

8. The display panel according to claim 7, wherein the plurality of second connection lines of the plurality of connection wirings are arranged along the first direction;

there are at least two adjacent second connection lines of the plurality of second connection lines, each of the at least two adjacent second connection lines comprises the fifth connection segment and the plurality of sixth connection segments, there is a third gap between two adjacent sixth connection segments of the sixth connection segments of the at least two adjacent second connection lines, where the two adjacent sixth connection segments are aligned along the first direction, and the third gap, the first gap, and the second gap are misaligned along the first direction.

9. The display panel according to claim 8, wherein at least one of the first gap, the second gap, and the third gap has an orthographic projection on the base layer non-overlapping with the orthographic projections of the plurality of anodes on the base layer.

10. The display panel according to claim 8, further comprising:

a metal compensation pattern, wherein an orthographic projection of the metal compensation pattern on the base layer overlaps with an orthographic projection of at least one of the first gap, the second gap, and the third gap on the base layer.

11. The display panel according to claim 10, wherein the first metal layer comprises the metal compensation pattern.

12. The display panel according to claim 10, wherein the metal compensation pattern and the second metal layer comprise the same material.

13. The display panel according to claim 2, further comprising:

an insulation layer, disposed between the first metal layer and the second metal layer, and comprising a plurality of via holes, wherein the plurality of connection wirings are connected to the plurality of data lines respectively through the plurality of via holes, and orthographic projection of the plurality of via holes on the base layer and the orthographic projections of the plurality of anodes on the base layer are arranged in a staggered manner.

14. The display panel according to claim 1, wherein each of the plurality of data lines extends along the second direction.

15. The display panel according to claim 2, wherein the display panel further comprises a corner compensation area located at a corner of the display area, the second metal layer may further comprises a corner compensation grid located at the corner compensation area, and a design of the corner compensation grid patterns is the same as a design of the compensation grid pattern.

16. The display panel according to claim 1, wherein each of the metal grids comprises first grid lines each extending along the first direction and second grid lines each extending along the second direction, and the first grid lines are connected to the second grid lines.

17. The display panel according to claim 1, wherein the compensation grid pattern is connected to the cathode layer.

18. A display device, comprising the display panel of claim 1.

19. A display panel, comprising a display area, and comprising:

a base layer;

a first metal layer, disposed on the base layer and comprising a plurality of data lines arranged in the display area; and a second metal layer, disposed on the base layer, insulated from the first metal layer, and comprising a plurality of connection wirings arranged in the display area, wherein the plurality of connection wirings are arranged at intervals and respectively connected to the plurality of data lines, each of the connection wirings comprises a first connection line and a second connection line connected with each other, the second connection line is bent relative to the first connection line, and the first connection line is connected between the second connection line and one of the data lines;

wherein there is at least one first connection line of a plurality of first connection lines of the plurality of connection wirings, the at least one first connection line comprises a plurality of first connection segments each extending along a first direction, a plurality of second connection segments each extending along the first direction, and a plurality of third connection segments each extending along a second direction, the plurality of first connection segments and the plurality of second connection segments are alternately and staggered along the first direction, one first connection segment of the plurality of first connection segments and an adjacent one second connection segment of the plurality of second connection segments are connected to both sides of one of the plurality of third connection segments in the first direction, and the first direction intersects the second direction;

wherein display panel further comprises:

a light-emitting element layer, disposed on sides of the first metal layer and the second metal layer away from the base layer, and comprising an anode layer, light-emitting layers, and a cathode layer, wherein the light-emitting layers are disposed between the anode layer and the cathode layer, the anode layer is located on a side of the light-emitting layers adjacent to the base layer and comprises a plurality of anodes arranged at intervals; and wherein there is at least one first connection segment of the plurality of first connection segments and at least one second connection segment of the plurality of second connection segments, orthographic projections of the at least one first connection segment and the at least one second connection segment on the base layer do not overlap with orthographic projections of the plurality of anodes on the base layer; and there is at least one third connection segment of the plurality of third connection segments, and an orthographic projection of a portion of the at least one third connection segment on the base layer does not overlap with the orthographic projections of the plurality of anodes on the base layer;

wherein the at least one first connection line further comprises a plurality of fourth connection segments each extending along the second direction, each of the plurality of fourth connection segments is disposed between two adjacent ones of the plurality of third connection segments, the plurality of fourth connection segments and the plurality of third connection segments are staggered along the first direction, and each of the plurality of fourth connection segments is connected to one of the plurality of first connection segments or one of the plurality of second connection segments; and wherein the plurality of first connection lines of the plurality of connection wirings are arranged along the second direction;

there are at least two adjacent first connection lines of the plurality of first connection lines, each of the at least two adjacent first connection lines comprises the plurality of first connection segments, the plurality of second connection segments, the plurality of third connection segments, and the plurality of fourth connection segments; and there is a first gap between two adjacent third connection segments of the third connection segments of the at least two adjacent first connection lines, where the two adjacent third connection segments are aligned along the second direction; there is a second gap between two adjacent fourth connection segments of the fourth connection segments of the at least two adjacent first connection lines, where the two adjacent fourth connection segments are aligned along the second direction; and the first gap and the second gap are misaligned along the first direction.

20. A display panel, comprising a display area, and comprising:

a base layer;

a first metal layer, disposed on the base layer and comprising a plurality of data lines arranged in the display area; and a second metal layer, disposed on the base layer, insulated from the first metal layer, and comprising a plurality of connection wirings arranged in the display area, wherein the plurality of connection wirings are arranged at intervals and respectively connected to the plurality of data lines, each of the connection wirings comprises a first connection line and a second connection line connected with each other, the second connection line is bent relative to the first connection line, and the first connection line is connected between the second connection line and one of the data lines;

wherein there is at least one first connection line of a plurality of first connection lines of the plurality of connection wirings, the at least one first connection line comprises a plurality of first connection segments each extending along a first direction, a plurality of second connection segments each extending along the first direction, and a plurality of third connection segments each extending along a second direction, the plurality of first connection segments and the plurality of second connection segments are alternately and staggered along the first direction, one first connection segment of the plurality of first connection segments and an adjacent one second connection segment of the plurality of second connection segments are connected to both sides of one of the plurality of third connection segments in the first direction, and the first direction intersects the second direction;

wherein display panel further comprises:

a light-emitting element layer, disposed on sides of the first metal layer and the second metal layer away from the base layer, and comprising an anode layer, light-emitting layers, and a cathode layer, wherein the light-emitting layers are disposed between the anode layer and the cathode layer, the anode layer is located on a side of the light-emitting layers adjacent to the base layer and comprises a plurality of anodes arranged at intervals; and wherein there is at least one first connection segment of the plurality of first connection segments and at least one second connection segment of the plurality of second connection segments, orthographic projections of the at least one first connection segment and the at least one second connection segment on the base layer do not overlap with orthographic projections of the plurality of anodes on the base layer; and there is at least one third connection segment of the plurality of third connection segments, and an orthographic projection of a portion of the at least one third connection segment on the base layer does not overlap with the orthographic projections of the plurality of anodes on the base layer; and wherein the display panel further comprises a bonding area disposed outside the display area; and the second metal layer further comprises a compensation grid pattern arranged in the display area and disposed on a side of the plurality of connection wirings away from the bonding area, the compensation grid pattern comprises a plurality of interconnected metal grids, and each of the metal grids is arranged around a grid opening.

* * * * *